(12) United States Patent
Windmueller

(10) Patent No.: US 7,308,595 B2
(45) Date of Patent: Dec. 11, 2007

(54) METHOD AND DEVICE FOR GENERATING AN INTERNAL TIME BASE FOR A DIAGNOSTIC FUNCTION FOR AN OUTPUT MODULE

(75) Inventor: Andreas Windmueller, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 237 days.

(21) Appl. No.: 10/920,070

(22) Filed: Aug. 17, 2004

(65) Prior Publication Data

US 2005/0066215 A1 Mar. 24, 2005

(30) Foreign Application Priority Data

Sep. 23, 2003 (DE) ................. 103 44 004

(51) Int. Cl.
*G06F 1/14* (2006.01)
(52) U.S. Cl. .................................. 713/500
(58) Field of Classification Search ................. 713/500
See application file for complete search history.

(56) References Cited

U.S. PATENT DOCUMENTS 4,670,837 A * 6/1987 Sheets ..................... 713/501

5,268,937 A 12/1993 Marbot
6,031,743 A * 2/2000 Carpenter et al. ............ 363/65
6,621,352 B2 * 9/2003 Matsumoto et al. ......... 331/1 A

FOREIGN PATENT DOCUMENTS

DE 197 33 748 2/1999
WO WO 8707054 11/1987

* cited by examiner

Primary Examiner—Rehana Perveen
Assistant Examiner—Eric Chang
(74) Attorney, Agent, or Firm—Kenyon & Kenyon LLP

(57) ABSTRACT

A device for generating an internal time base for a diagnostic function for an output module that is connectable to a serial interface, which contains a clock line, data being transmitted via this serial interface from and/or to the output module according to a clock pulse on the clock line, and including a determining arrangement to determine the internal time base for the output module from the clock pulse transferred on the clock line of the serial interface.

10 Claims, 2 Drawing Sheets

METHOD AND DEVICE FOR GENERATING AN INTERNAL TIME BASE FOR A DIAGNOSTIC FUNCTION FOR AN OUTPUT MODULE

FIELD OF THE INVENTION

The present invention is directed to a device and a method for generating an internal time base for a diagnostic function for an output module as well as a corresponding output module.

BACKGROUND INFORMATION

Output modules require an internal time base in order to represent fault detection mechanisms for diagnostic functions on the output module. This time base is implemented, for example, by an oscillator circuit integrated on the chip. A disadvantage of these circuits for generating the internal time base may be a high degree of imprecision. The specified range fluctuates sometimes by up to a factor of 4, for example, from 60 to 240 µs.

Furthermore, output modules are connected to a control device or a control unit, which responds to the output module, via a serial interface for data transmission, for example, to configure the module or to read out diagnostic information, as referred to German patent document no. 197 33 748.

SUMMARY OF THE INVENTION

An object of the exemplary embodiment and/or exemplary method of the present invention is to achieve a higher precision in generating the internal time base for a diagnostic function on the output module and times derived from it.

The object may be achieved by a device and a method for generating an internal time base for a diagnostic function for an output module, the output module being connectable to a serial interface, which in turn includes a clock line, via which data from and/or to the output module is transmitted according to a clock pulse apparatus, arrangement or structure being advantageously provided, which determine the internal time base for the output module from the clock pulse transmitted on the clock line of the serial interface. The clock line of a serial interface is thus used as a time base for diagnostic functions on an output module. This means that if times for diagnostic purposes must be derived within the type, i.e., within the output stage, this is implemented by transforming the clock pulses of a serial interface.

In an advantageous manner, a second apparatus, arrangement or structure are provided which determine a filter time or a debouncing time from the clock pulse for fault detection mechanisms for the diagnostic function.

Advantageously, an electronic counter is provided, which detects the individual clock pulses, and the counted clock pulses form the basis for the internal time base of the output module.

In the device, a clock pulse setting apparatus, arrangement or structure, in particular a quartz oscillator, is contained in a microprocessor, which is connectable to the output module via the serial interface, the clock pulse setting apparatus, arrangement or structure advantageously delivering a relatively accurate frequency or a relatively accurate clock pulse for the clock line of the serial interface and thus for the internal time base of the output module. A serial peripheral interface (SPI) or a microsecond bus as shown, for example, in the aforementioned DE 197 33 748 C2, is advantageously used as a serial interface.

Advantageously, the clock pulse of the clock line of the serial interface is constantly applied to the output module as soon as the output module is in operation, i.e., consumes energy.

Advantageously, a cell cycle, corresponding to the specified filter time or debouncing time, is specified as a function of the clock pulse of the clock line of the serial interface.

In an advantageous manner, the exemplary embodiment and/or exemplary method of the present invention may result in cost savings because a fixed internal time base may be omitted, in particular an oscillator circuit may be omitted.

DETAILED DESCRIPTION

Figure 1:
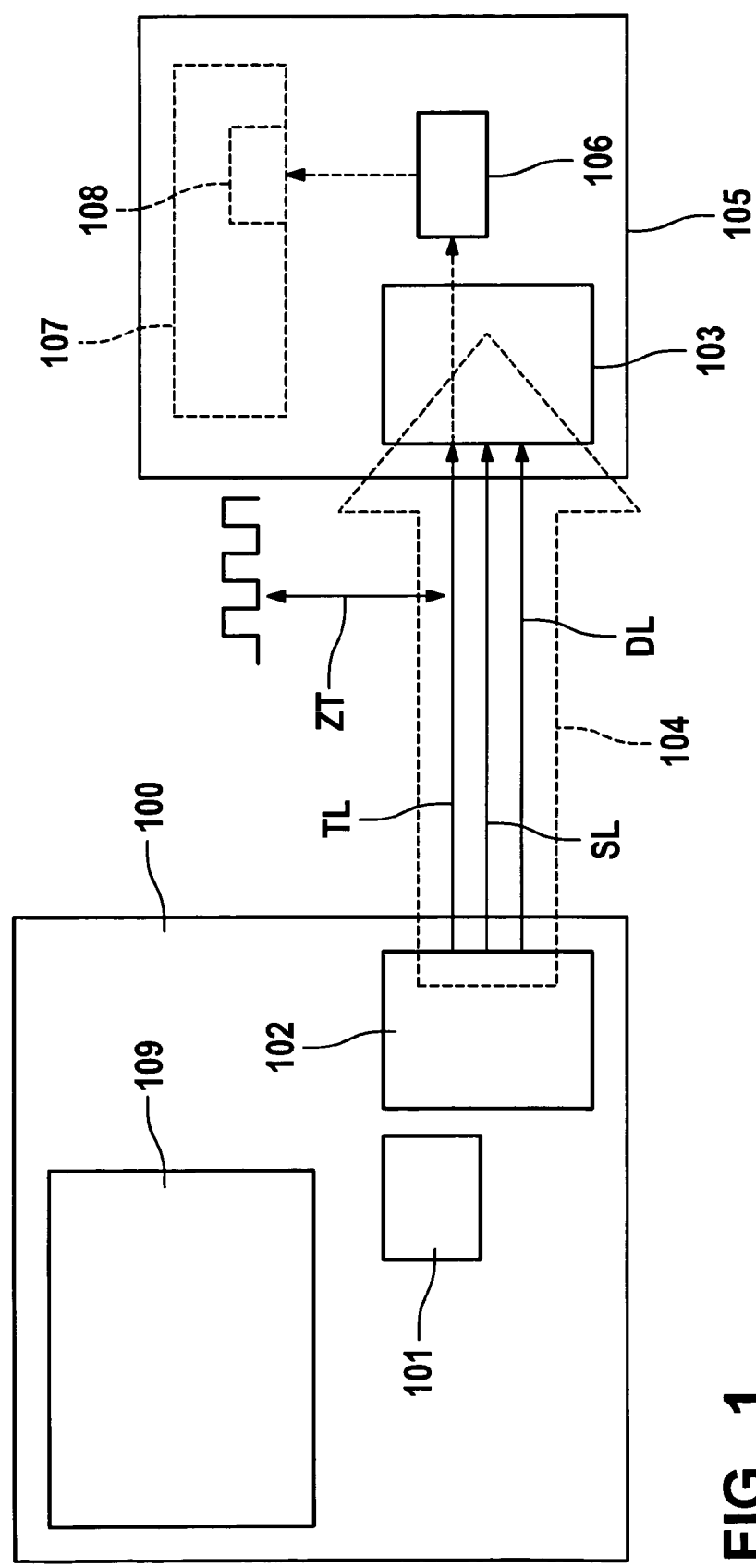
FIG. 1 shows an exemplary device according to the present invention in which a processor unit and an output module are connected by a serial interface.

An exemplary embodiment of the present invention uses the clock line of a serial interface as a time base. If within the type, i.e., within the output stage, times must be derived for diagnostic purposes, i.e., fault detection mechanisms in particular, this may be implemented according to the exemplary embodiment and/or exemplary method of the present invention by detecting, in particular counting, the clock pulses of a serial interface such as SPI or microsecond bus. Since the clock frequency of a serial interface is provided by a microprocessor, i.e., a processor unit, which in turn obtains its clock pulse from a relatively accurate time base, a quartz oscillator in particular, the clock pulse, i.e., the frequency of the same and thus also the derived time base of the output module is relatively accurate, in particular compared to an oscillator circuit normally used, for example, a voltage controlled oscillator (VCO), which as a result, may be omitted according to the exemplary embodiment and/or exemplary method of the present invention. To that end, FIG. 1 shows a processor unit or microprocessor or control unit 100. Such a control unit is used in particular for controlling operating sequences in a vehicle, such as, for example, in connection with the engine control, the brake control, or the transmission control, etc. However, such control units or processor units may also be used in process automation, in machine tools or also in other industrial applications. This processor unit 100 is connected to an output module, in particular, a power output stage 105 via a serial interface 104, for example, an SPI or microsecond bus. A first interface module 102 is provided in processor unit 100 and a second interface module 103 is provided in output stage 105. Interface 104 itself contains a data line DL, a synchronization line SL and a clock line TL, on which a clock pulse TZT is transmitted. The exemplary embodiment and/or exemplary method of the present invention uses a clock line TL within serial interface 104, so that according to the exemplary embodiment and/or exemplary method of the present invention any interface that meets this precondition is usable according to the exemplary embodiment and/or exemplary method of the present invention and thus may be regarded as having been disclosed herein. Processor unit 100 contains a processing unit 109 and a clock pulse setting apparatus, arrangement or structure 101 having a relatively accurate clock pulse, a quartz oscillator in particular. According to the exemplary embodiment and/or exemplary method of the present invention, the clock pulse of clock pulse setting apparatus, arrangement or structure 101 is more accurate than a normal internal time base of the output module, which according to the exemplary embodiment and/or exemplary method of the present invention, may be omitted.

Moreover, output module 105 contains a first apparatus, arrangement or structure 106, in particular an electronic counter, which detects the clock pulses ZT of clock line TL of serial interface 104 and thus constitutes the basis for generating the internal time base of output module 105. In addition to a counter, a time analysis apparatus, arrangement or structure or frequency analysis apparatus, arrangement or structure for clock pulse detection may be provided. The diagnostic functionality is shown symbolically in a diagnostic block 107, a second apparatus, arrangement or structure 108 being contained in the output stage, in particular as a part of diagnostic block 107. The second apparatus, arrangement or structure 108 is provided for determining a filter time FT for the diagnostic functionality, shown here symbolically as block 107, from the clock pulse or from the signal output by a first apparatus, arrangement or structure 106. This is accomplished by processing the clock pulses or the detected signal, for example, by factorization, division, or comparable transformations.

The underlying clock pulse may, for example, be derived from an SPI as serial interface 104 or from a microsecond bus. In a microsecond bus, a serial shift register is used, which is activated within the processor unit by a clock pulse setting apparatus, arrangement or structure 101 in order to implement a parallel-serial conversion of a plurality of parallel pins on the serial interface. The clock pulse for the shift register in interface module 102 is selected here to be high enough that a specific number of bits may be transmitted in a very short time, such as, for example, 16 bits in a microsecond, hence the name microsecond bus. In output stage 105 or in interface module 103, respectively, a serial-parallel conversion takes place again, which allows for activating a corresponding number of parallel output module transistors in a power output module in parallel using the converted signal. As with SPI, in this case also, a clock pulse ZT is provided on clock line TL of serial interface 104 for data transmission. An SPI clock pulse typically has 1 MHz, thus for example, a clock pulse period of 1 µs, while a microsecond bus clock pulse is, for example, in the range of 16 MHz and thus represents a clock pulse period of 62.5 ns.

According to the exemplary embodiment and/or exemplary method of the present invention, it is a precondition that the clock pulse is permanently applied to the output module during its operation. This may be set on the microcontroller side, i.e., on the side of processor unit 100 in such a way that the clock pulse is active after the control unit, i.e., processor unit 100, is powered up and initialized, and thus, in the case of an engine control, even before the engine start and until the power consumption is ended, i.e., for example, in an engine control until the end of running-on. This means that the clock pulse of clock line TL must be present during the entire phase in which power is supplied to output module 105, i.e., the output stage is in operation.

According to the exemplary embodiment and/or exemplary method of the present invention, the time base obtained by the clock line is used for diagnostic functions, in particular, for determining a diagnostic filter time or debouncing time. This is shown in the state diagram of FIG. 2. If faults occur, for example, a short-circuit to ground, a short-circuit to battery voltage or a load drop of the corresponding control unit plug connection, a fault is not reported further before the elapse of a filter time or debouncing time in order to avoid false reports caused by brief internal interference. Filter times are also used for additional functions such as monitoring of a voltage threshold, in particular of the supply voltage such as, for example, 5V. This means that a check is made as to whether or not a specific fault is present for a specific time.

The following faults are detected using such fault detection mechanisms: a short-circuit of the output stage output or of load to ground SCG, a short circuit of the output stage output or of load to battery voltage SCB, a load drop or line interruption between the output stage output and load, or load and battery voltage OL, if the current in the powered up state is too high due, for example, to shunts in the cable harness, the output stage has too high a temperature OT, or the supply voltage of the output module is too low or too high. A fault is reported only after the elapse of a bouncing time or filter time FT and, for example, an entry is made into a fault register or diagnostic register. Only if the fault is present for longer than the filter time is a fault entry made and the fault may be read out.

In the output module, the filter times are implemented, for example, by a clock counter. For example, to implement a filter time in the range of 50 µs, it would also be necessary to count 50 in an SPI interface having a µs clock pulse period. A 6 bit counter may thus be used for this purpose. In the case of the microsecond bus having a clock pulse period of 62.5 ns, it is necessary to count to 800, it being possible to use a 10 bit counter.

Figure 2:
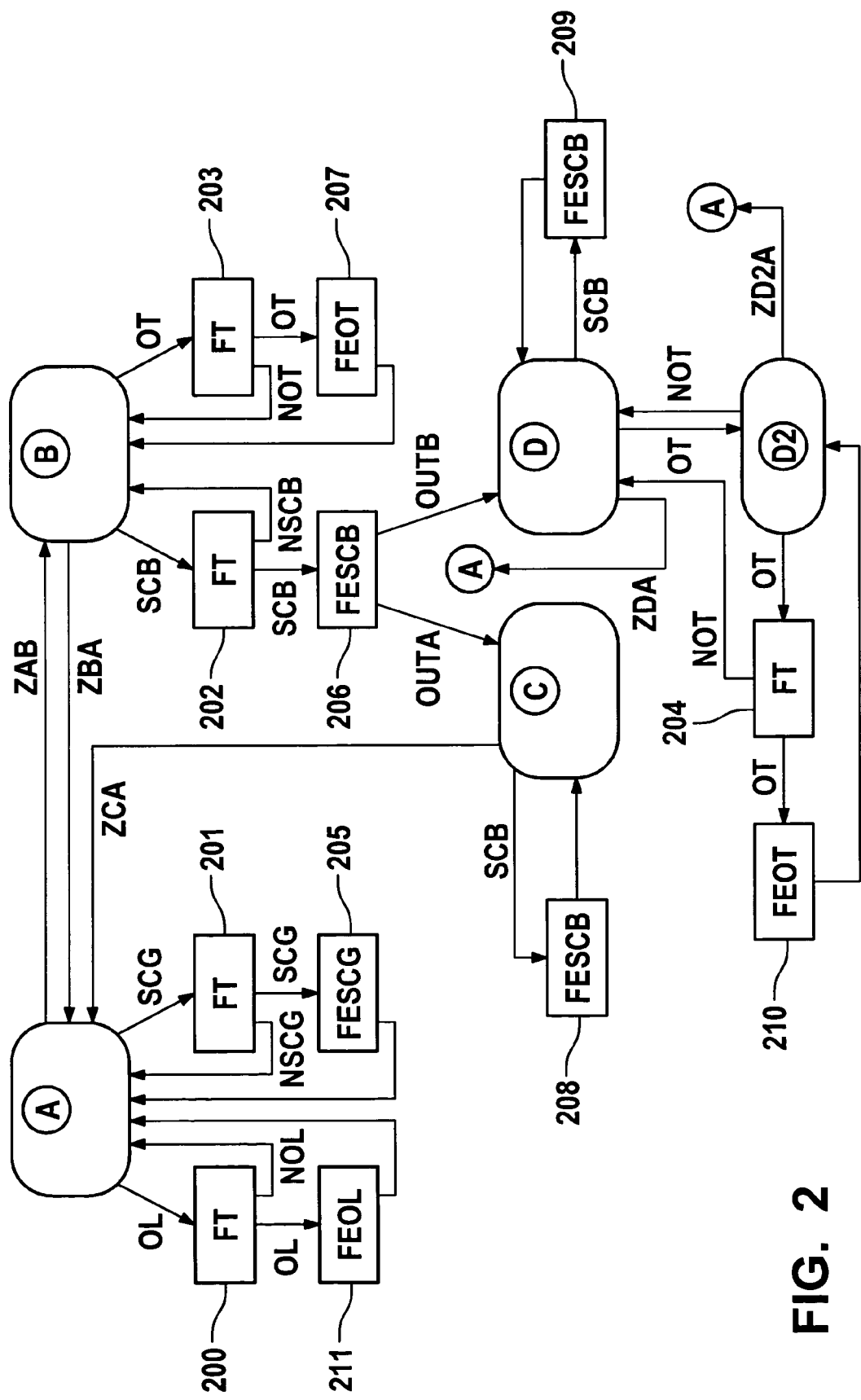
FIG. 2 shows a state diagram of diagnostic functions on the output stage, a time derivation being made from the time base of the exemplary method of the present invention, in particular for representing filter times.

FIG. 2 shows various states of output module A through D and D2, which are essentially characterized by the level of the signal on data line DL, i.e., high or low as the input pin and simultaneously of the switching state of the corresponding output stage output on or off. In state A, the input pin is high and output is off. In state B, the input pin is low and the output is on. Thus, a state transition ZAB occurs from A to B in which the input pin is switched from high to low. The input pin thus controls the power output module. Conversely, a switch of the input pin from low to high causes a transition to occur from state B to state A ZBA. If a load drop OL occurs in state A, this is verified in block 200 on the basis of a filter time FT. If fault OL is no longer present after the elapse of filter time FT, a decision is made for no load drop fault No OL NOL and the system returns to state A. Otherwise, i.e., if fault OL is present after the elapse of filter time FT, a fault entry FEOL of this fault is made in block 211. If a short-circuit to ground SCG occurs in state A, a check is also made here in block 201 using filter time FT as to whether the fault continues to exist. If the fault does not continue to exist, a decision is made for no fault NSCG and the system returns to state A. Otherwise a fault entry FESCG is made in block 205.

In state B, characterized by input pin low and output on, for example, an overtemperature fault OT occurs. In block 203, this overtemperature fault is checked based on filter time FT and if the fault persists, it is accordingly recorded in block 207 as fault entry FEOT. If overtemperature OT, registered, for example, as exceeding the threshold value, is not permanent in the context of filter time FT, no fault NOT is detected and the system returns to state B. If in state B of the output module, a fault SCB, i.e., a short-circuit to battery is detected, a check is made as to whether it is permanent also based on filter time FT. If the fault is not permanent, a decision is again made for no fault No SCB NSCB and the system returns to state B. If fault SCB is permanent, a fault entry FESCB is made in block 206.

Based on this fault entry FESCB in block 206, the procedure branches off, for example, into two states, C or D. This may occur, for example, as a function of specific outputs of output stage Out A or Out B, i.e., as a function of which output of the output module is or is not switched on. Likewise, the branching may occur whether or not a current limitation is switched on, thus for example, in state D if the current limitation is on and in state C if it is not on. In state D, the input pin is low and the output is on. A transition back to state A occurs via ZDA by a switchover of the input pin from low to high. If a fault SCB occurs in state D, fault entry FESCB is made in block 209 and the system returns to state D.

If an overtemperature fault OT occurs, for example, the procedure branches off into a state D2 in which the input pin is also on low but the output is switched off. If in this state D2, fault OT no longer occurs, the procedure branches off into state D via NOT. Likewise, switching the input pin from low to high causes branching from state D2 via ZD2A into state A. If in state D2, overtemperature fault OT continues to occur, filter time FT is used in block 204 to verify if the fault will be registered. If fault OT does not continue to exist after the end of the filter time, the procedure branches back to state D via NOT. In the other case, i.e., if fault OT continues to exist beyond filter time FT or upon elapse of the filter time, fault entry FEOT is again made in block 210 and the system returns to state D2. In the case of branching from block 206 into state C, it is also possible, for example, if a fault SCB occurs, for a fault entry FESCB to be made in block 208 without filter time determination. A transition from state C into state A occurs via ZCA by switching the input pin from low to high, state C being characterized by input pin low and output off.

In this example, all filter times FT are selected to be the same. However, according to the exemplary embodiment and/or exemplary method of the present invention, different filter times may be provide as a function of the particular fault. Using these filter times, debouncing occurs with respect to the fault entries, the filter time being derived according to the exemplary embodiment and/or exemplary method of the present invention, as already described, from clock signal ZT of clock line TL of the serial interface; accordingly, an explicit internal time base such as a VCO, i.e., an oscillator circuit may be thus omitted in an advantageous manner.

What is claimed is:

1. A device to generate an internal time base for a diagnostic function for an output module, the device comprising:
   a first arrangement to determine the internal time base for the diagnostic function for the output module from a clock pulse transferred on the clock line of a serial interface, wherein the diagnostic function detects a fault condition involving the output module, the output module being connectable to the serial interface, which includes a clock line, data being transferrable via the serial interface at least one of from and to the output module according to the clock pulse on the clock line; and
   a second arrangement to determine a diagnostic filter time for the diagnostic function from the clock pulse, wherein the fault condition is not reported unless the fault condition exists for a period longer than the diagnostic filter time.

2. The device of claim 1, wherein the first arrangement includes an electronic counter, which detects individual clock pulses.

3. The device of claim 1, wherein a clock pulse setting arrangement is in a microprocessor, which sets the clock pulse of the clock line, and the microprocessor is connected to the output module via the serial interface.

4. The device of claim 1, wherein the serial interface includes an SPI.

5. The device of claim 1, wherein the serial interface includes a microsecond (µ-second) bus.

6. An output module comprising:
   a device to generate an internal time base for a diagnostic function for the output module, the output module being connectable to a serial interface, which includes a clock line, data being transferrable via the serial interface at least one of from and to the output module according to a clock pulse transferred on the clock line;
   wherein the output module includes a first arrangement to determine the internal time base for the diagnostic function for the output module from the clock pulse transferred on the clock line of the serial interface, wherein the diagnostic function detects a fault condition involving the output module, and wherein the output module includes a second arrangement to determine a diagnostic filter time for the diagnostic function from the clock pulse, wherein the fault condition is not reported unless the fault condition exists for a period longer than the diagnostic filter time.

7. The output module of claim 6, wherein the first arrangement includes an electronic counter to detect individual clock pulses.

8. A method to generate an internal time base for a diagnostic function for an output module, the output module being connectable to a serial interface, which includes a clock line, data being transferrable via the serial interface at least one of from and to the output module according to a clock pulse on the clock line, the method comprising:
   determining the internal time base for the diagnostic function for the output module from the clock pulse transferred on the clock line of the serial interface, wherein the diagnostic function detects a fault condition involving the output module; and
   determining a diagnostic filter time for the diagnostic function from the clock pulse, wherein the fault condition is not reported unless the fault condition exists for a period longer than the diagnostic filter time.

9. The method of claim 8, wherein the clock pulse is constantly applied to the output module when the output module is consuming energy.

10. The method of claim 8, wherein a counting cycle corresponding to a predetermined filter time is specified as a function of the clock pulse of the clock line of the serial interface.

* * * * *